United States Patent
Kang

(10) Patent No.: US 10,699,754 B2
(45) Date of Patent: Jun. 30, 2020

(54) REFERENCE VOLTAGE GENERATING CIRCUIT, BUFFER, SEMICONDUCTOR APPARATUS, AND SEMICONDUCTOR SYSTEM USING THE REFERENCE VOLTAGE GENERATING CIRCUIT

(71) Applicant: SK hynix Inc., Icheon-si, Gyeonggi-do (KR)

(72) Inventor: Ji Hyo Kang, Seongnam-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/206,841

(22) Filed: Nov. 30, 2018

(65) Prior Publication Data

US 2019/0348082 A1 Nov. 14, 2019

(30) Foreign Application Priority Data

May 10, 2018 (KR) ........................ 10-2018-0053544

(51) Int. Cl.
| | | |
|---|---|---|
| *G11C 5/14* | (2006.01) | |
| *G11C 8/10* | (2006.01) | |
| *G11C 8/12* | (2006.01) | |
| *G11C 7/14* | (2006.01) | |
| *G11C 11/40* | (2006.01) | |
| *G11C 7/10* | (2006.01) | |

(52) U.S. Cl.
CPC ............ *G11C 5/147* (2013.01); *G11C 7/1084* (2013.01); *G11C 7/14* (2013.01); *G11C 8/10* (2013.01); *G11C 11/40* (2013.01)

(58) Field of Classification Search
CPC .. G11C 5/147; G11C 8/10; G11C 8/12; G11C 7/14; G11C 11/40; G11C 7/1084
See application file for complete search history.

(56) References Cited

U.S. PATENT DOCUMENTS

| 6,545,510 B1* | 4/2003 | Cowles ............ G01R 19/16519 |
| | | 327/74 |
| 6,700,416 B2 | 3/2004 | Cowles |
| 7,868,809 B2 | 1/2011 | Iadanza et al. |
| 9,792,964 B1* | 10/2017 | Okuma ................ G11C 7/1084 |
| 2003/0122589 A1* | 7/2003 | Cowles ............ G01R 19/16519 |
| | | 327/74 |
| 2004/0223365 A1* | 11/2004 | Choi ..................... G11C 7/1051 |
| | | 365/154 |
| 2007/0001750 A1* | 1/2007 | Jin ......................... G11C 5/147 |
| | | 327/540 |
| 2009/0010078 A1* | 1/2009 | Do ......................... G11C 5/147 |
| | | 365/189.09 |
| 2013/0147544 A1* | 6/2013 | Kim ....................... G05F 3/242 |
| | | 327/538 |

(Continued)

*Primary Examiner* — Daniel Kessie
*Assistant Examiner* — Sisay G Tiku
(74) *Attorney, Agent, or Firm* — William Park & Associates LTD.

(57) ABSTRACT

A semiconductor apparatus includes a reference voltage generating circuit and a buffer. The reference voltage generating circuit may generate, based on a voltage setting signal, a first reference voltage and a second reference voltage, which has the same level as the first reference voltage or has a lower level than the first reference voltage by an amount of a unit level. The buffer may generate an output signal based on the first reference voltage, the second reference voltage and an input signal.

26 Claims, 7 Drawing Sheets

(56) References Cited

U.S. PATENT DOCUMENTS

| | | | |
|---|---|---|---|
| 2013/0162342 A1* | 6/2013 | Song | G11C 5/147 327/543 |
| 2014/0153344 A1* | 6/2014 | Kim | G11C 5/147 365/189.09 |
| 2015/0263703 A1* | 9/2015 | Ko | G11C 7/14 327/143 |
| 2016/0164465 A1* | 6/2016 | Lee | H03F 1/308 330/250 |
| 2016/0372171 A1* | 12/2016 | Ko | G11C 7/22 |
| 2017/0287535 A1* | 10/2017 | Lee | G11C 29/028 |
| 2019/0158109 A1* | 5/2019 | Kavala | H03M 1/785 |

* cited by examiner

REFERENCE VOLTAGE GENERATING CIRCUIT, BUFFER, SEMICONDUCTOR APPARATUS, AND SEMICONDUCTOR SYSTEM USING THE REFERENCE VOLTAGE GENERATING CIRCUIT

CROSS-REFERENCES TO RELATED APPLICATION

The present application claims priority under 35 U.S.C. § 119(a) to Korean application number 10-2018-0053544, filed on May 10, 2018, in the Korean Intellectual Property Office, which is incorporated herein by reference in its entirety as set forth in full.

BACKGROUND

1. Technical Field

Various embodiments of the present disclosure relate to an integrated circuit technology and, more particularly, to a reference voltage generating circuit, buffer, semiconductor apparatus, and a semiconductor system.

2. Related Art

An electronic device includes a lot of electronic elements, and a computer system includes a plurality of semiconductor apparatuses, each comprising a semiconductor. The semiconductor apparatuses configuring the computer system may communicate with one another by transmitting and receiving clocks and data to and from one another. The semiconductor apparatus includes a buffer configured to receive a signal provided from an external apparatus or receive a signal provided between internal circuits thereof. The buffer may perform a differential amplification operation. The buffer may receive a differential signal and a single ended signal, and may require a reference voltage in order to amplify the single ended signal. Therefore, the semiconductor apparatus may receive the reference voltage from an external apparatus or may include a reference voltage generating circuit configured to internally generate the reference voltage.

SUMMARY

In an embodiment of the present disclosure, a semiconductor apparatus may include a reference voltage generating circuit, and a buffer. The reference voltage generating circuit may be configured to generate, based on a voltage setting signal, a first reference voltage and a second reference voltage, which has the same level as the first reference voltage or has a lower level than the first reference voltage by an amount of a unit level. The buffer may be configured to generate an output signal based on the first reference voltage, the second reference voltage and an input signal, wherein the first reference voltage is selected from a plurality of first reference voltages and the second reference voltage is selected from a plurality of second reference voltages based on the voltage setting signal.

In an embodiment of the present disclosure, a semiconductor apparatus may include a reference voltage generating circuit, and a buffer. The reference voltage generating circuit may be configured to generate, based on a voltage setting signal, a first reference voltage and a second reference voltage. The reference voltage generating circuit may be configured to output one of the first reference voltage and the second reference voltage based on a voltage selection signal. The buffer configured to generate an output signal based on the first reference voltage, the second reference voltage and an input signal.

DETAILED DESCRIPTION

Hereinafter, a semiconductor apparatus according to the present disclosure will be described below with reference to the accompanying drawings through exemplary embodiments.

Figure 1:
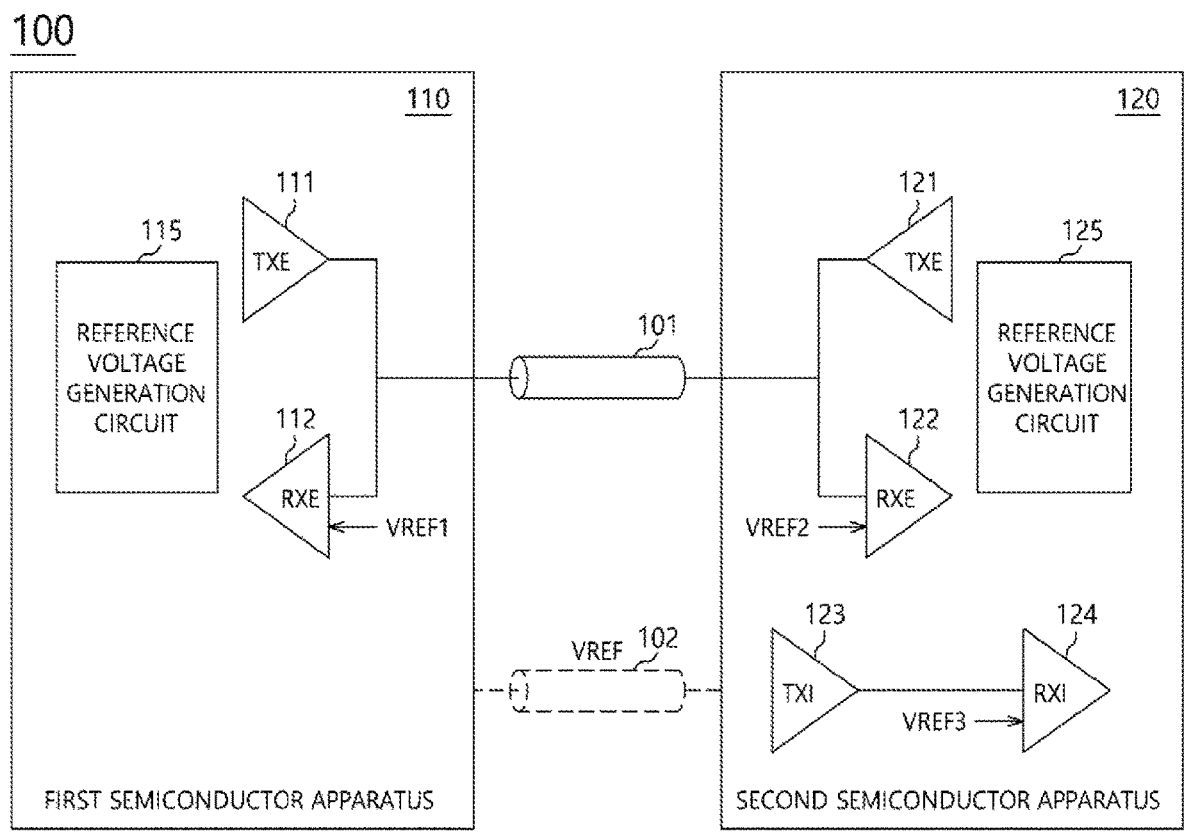
FIG. 1 is a diagram illustrating a configuration of a semiconductor system in accordance with an embodiment.

FIG. 1 is a diagram illustrating a configuration of a semiconductor system 1 in accordance with an embodiment. Referring to FIG. 1, the semiconductor system 1 may include a first semiconductor apparatus 110 and a second semiconductor apparatus 120. The first semiconductor apparatus 110 may provide various control signals required for operations of the second semiconductor apparatus 120. For example, the first semiconductor apparatus 110 may be a host apparatus such as the central processing unit (CPU), the graphic processing unit (GPU), the multi-media processor (MMP), the digital signal processor, the application processor (AP) and a memory controller. The second semiconductor apparatus 120 may be a memory apparatus. The memory apparatus may include the volatile memory device and the non-volatile memory. The volatile memory may include the static RAM (SRAM), the dynamic RAM (DARM), and the synchronous DRAM (SDRAM). The non-volatile memory may include the read only memory (ROM), the programmable ROM (PROM), the electrically erase and programmable ROM (EEPROM), the electrically programmable ROM (EPROM), the flash memory, the phase change RAM (PRAM), the magnetic RAM (MRAM), the resistive RAM (RRAM), and the ferroelectric RAM (FRAM).

The second semiconductor apparatus 120 may be coupled to the first semiconductor apparatus 110 through signal buses 101. The signal buses 101 may be signal transmission paths, links or channels configured to transfer external signals SE. The signal buses 101 may include a plurality of buses. For example, the signal buses 101 may include a clock bus, a command address bus, a data bus and so forth. The external signals SE may include a clock signal, a command address signal, a data signal and so forth. The second semiconductor apparatus 120 may be coupled to the first semiconductor apparatus 110 through the signal buses 101, and may communicate with the first semiconductor apparatus 110 through the signal buses 101. The first semiconductor apparatus 110 may provide the external signals SE to the second semiconductor apparatus 120 through the signal buses 101, and may receive the external signals SE provided from the second semiconductor apparatus 120 through the signal buses 101. The second semiconductor apparatus 120 may provide the external signals SE to the first semiconductor apparatus 110 through the signal buses 101, and may receive the external signals SE provided from the first semiconductor apparatus 110 through the signal buses 101.

The first semiconductor apparatus 110 may include an external signal transmitter (TXE) 111 and an external signal receiver (RXE) 112. The external signal transmitter 111 may be coupled to the signal buses 101, and may provide the external signals SE to the second semiconductor apparatus 120 through the signal buses 101. The external signal receiver 112 may be coupled to the signal buses 101, and may receive the external signals SE provided from the second semiconductor apparatus 120 through the signal buses 101. The second semiconductor apparatus 120 may include an external signal transmitter (TXE) 121 and an external signal receiver (RXE) 122. The external signal transmitter 121 may be coupled to the signal buses 101, and may provide the external signals SE to the first semiconductor apparatus 110 through the signal buses 101. The external signal receiver 122 may be coupled to the signal buses 101, and may receive the external signals SE provided from the first semiconductor apparatus 110 through the signal buses 101. The second semiconductor apparatus 120 may further include an internal signal transmitter (TXI) 123 and an internal signal receiver (RXI) 124. The internal signal transmitter 123 and the internal signal receiver 124 may be circuits configured to transfer signals within the second semiconductor apparatus 120. The internal signal transmitter 123 may transmit internal signals SI, and the internal signal receiver 124 may receive the internal signals SI provided from the internal signal transmitter 123.

The external signal receiver 112 of the first semiconductor apparatus 110 may use a first reference voltage VREF1 to receive the external signals SE. The external signal receiver 122 of the second semiconductor apparatus 120 may use a second reference voltage VREF2 to receive the external signals SE. The external signals SE transferred by the signal buses 101 may be differential signals or single ended signals. The external signal receiver 112 may receive the external signals SE by comparing a level of one among the differential signals or levels the single ended signals with a level of the first reference voltage VREF1 and by amplifying the levels of the differential signals or the single ended signals. The external signal receiver 122 may receive the external signals SE by comparing a level of one among the differential signals or levels of the single ended signals with a level of the second reference voltage VREF2 and by amplifying the levels of the differential signals or the single ended signals. The first reference voltage VREF1 and the second reference voltage VREF2 may have the same voltage level or different voltage levels. The internal signal receiver 124 may use a third reference voltage VREF3 to receive the internal signals SI. The internal signals SI may be differential signals or single ended signals. The internal signal receiver 124 may receive the internal signals SI by comparing a level of one among the differential signals or levels of the single ended signals with a level of the third reference voltage VREF3 and by amplifying the levels of the differential signals or the single ended signals. The second reference voltage VREF2 and the third reference voltage VREF3 may have the same voltage level or different voltage levels.

Referring FIG. 1, the first semiconductor apparatus 110 and the second semiconductor apparatus 120 may further include reference voltage generating circuits 115 and 125, respectively. The reference voltage generating circuit 115 may generate the first reference voltage VREF1 to be provided to the external signal receiver 112. The reference voltage generating circuit 125 may generate the second reference voltage VREF2 and the third reference voltage VREF3 to be provided to the external signal receiver 122 and the internal signal receiver 124, respectively. In an embodiment, the reference voltage generating circuit 115 may generate a particular reference voltage VREF to be used in the second semiconductor apparatus 120, and may provide the particular reference voltage VREF to the second semiconductor apparatus 120 through other signal buses 102. That is, the second semiconductor apparatus 120 may receive the second reference voltage VREF2 and the third reference voltage VREF3 provided from the first semiconductor apparatus 110.

Figure 2:
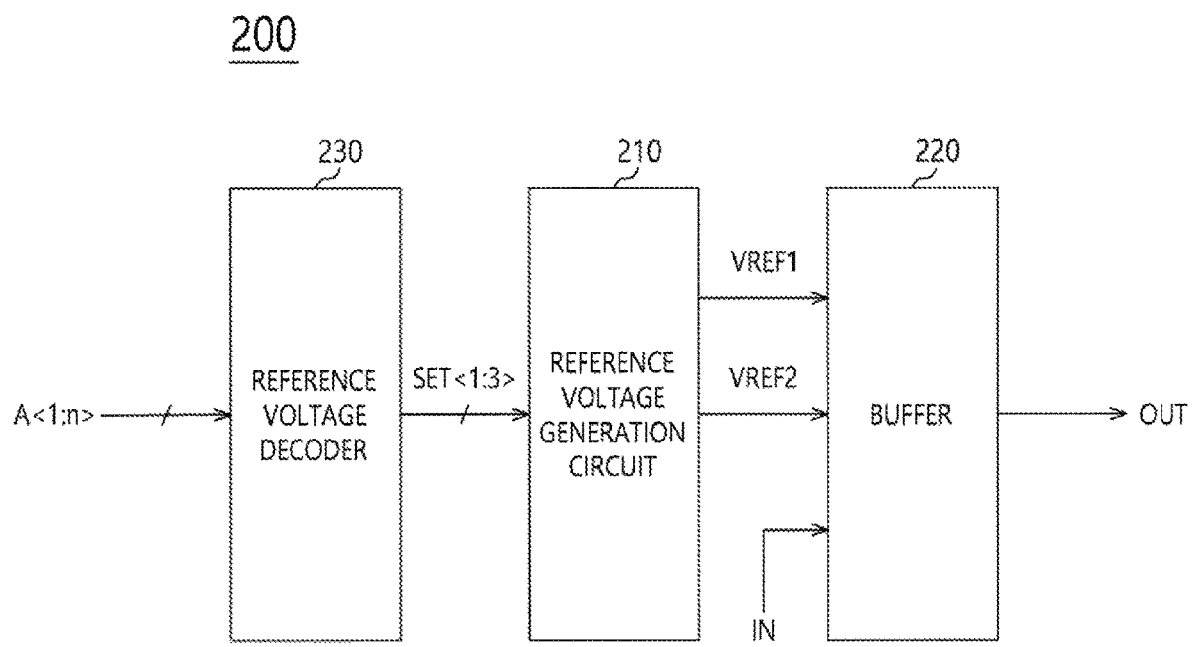
FIG. 2 is a diagram illustrating a configuration of a semiconductor apparatus in accordance with an embodiment.

FIG. 2 is a diagram illustrating a configuration of a semiconductor apparatus 200 in accordance with an embodiment. Referring to FIG. 2, the semiconductor apparatus 200 may include a reference voltage generating circuit 210 and a buffer 220. The reference voltage generating circuit 210 may be applied as the reference voltage generating circuit 115 or the reference voltage generating circuit 125 described with reference to FIG. 1. The buffer 220 may be applied as the external signal receiver 112, the external signal receiver 122 or the internal signal receiver 124 described with reference to FIG. 1. The reference voltage generating circuit 210 may receive a voltage setting signal SET<1:3>, and may generate a first reference voltage VREF1 and a second reference voltage VREF2, which have various voltage levels, based on the voltage setting signal SET<1:3>. The reference voltage generating circuit 210 may generate the first reference voltage VREF1 based on the voltage setting signal SET<1:3>, and may generate the second reference voltage VREF2 having the same level as the first reference voltage VREF1 or having a lower level than the first reference voltage VREF1 by an amount of a unit level. The first reference voltage VREF1 and the second reference voltage VREF2 may determine a target reference voltage of the buffer 220.

The reference voltage generating circuit 210 may select as the first reference voltage VREF1 and the second reference voltage VREF2 particular ones among voltages having various levels, respectively, based on the voltage setting signal SET<1:3>. Although the configuration illustrates that the voltage setting signal SET<1:3> is a 3-bit signal and the reference voltage generating circuit 210 is a 3-bit reference voltage generating circuit, the present invention will not be limited thereto. A number of bits of the voltage setting signal for selecting the first reference voltage VREF1 and the second reference voltage VREF2 generated by the reference voltage generating circuit 210 may vary.

The buffer 220 may generate an output signal OUT based on an input signal IN and the target reference voltage generated by the reference voltage generating circuit 210. The buffer 220 may generate the output signal OUT by amplifying a level of the input signal IN with a level of the target reference voltage provided from the reference voltage generating circuit 210. The buffer 220 may generate the output signal OUT based on the first reference voltage VREF1, the second reference voltage VREF2 and the input signal IN. The buffer 220 may generate the output signal OUT by amplifying a level of the input signal IN with levels of the first reference voltage VREF1 and the second reference voltage VREF2. The target reference voltage provided from the reference voltage generating circuit 210 to the buffer 220 may have a voltage level between the first reference voltage VREF1 and the second reference voltage VREF2.

Referring to FIG. 2, the semiconductor apparatus 200 may further include a reference voltage decoder 230. The reference voltage decoder 230 may receive an address signal A<1:n> ("n" is an integer equal to or greater than 2), and may generate the voltage setting signal SET<1:3>. The reference voltage decoder 230 may generate the voltage setting signal SET<1:3> by decoding the address signal A<1:n>, The voltage setting signal SET<1:3> may be generated such that the voltage setting signal SET<1:3> has different logic values according to the address signal A<1:n>. For example, the reference voltage decoder 230 may generate the voltage setting signal having (2n+1) number of different logic values according to the address signal A<1:n>. According to the number of bits of the voltage setting signal, all or part of the (2n+1) number of different logic values may be used. The address signal A<1:n> may have information to set a voltage level of the target reference voltage. In an embodiment, the reference voltage decoder 230 may be included in the reference voltage generating circuit 210 as an element thereof.

Figure 3:
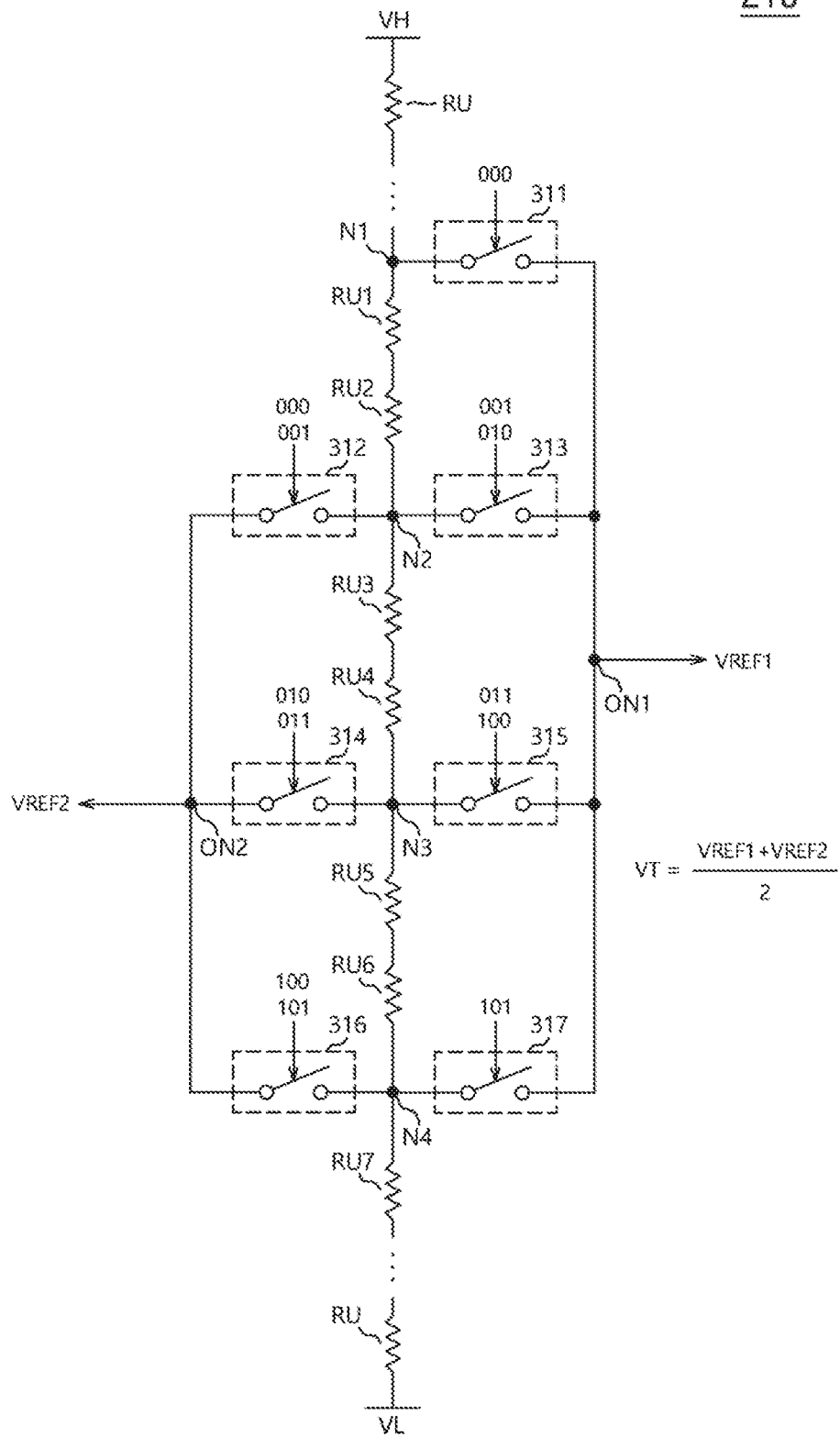
FIG. 3 is a diagram illustrating a configuration of a reference voltage generating circuit illustrated in FIG. 2.

FIG. 3 is a diagram illustrating a configuration of the reference voltage generating circuit 210 illustrated in FIG. 2. Referring to FIG. 3, the reference voltage generating circuit 210 may include a plurality of unit resistances RU. Each of the plurality of unit resistances RU may have a unit resistance value. The plurality of unit resistances RU may be serially coupled to each other between a high voltage VH node and a low voltage VL node. The high voltage VH may have a higher level than the low voltage VL. The reference voltage generating circuit 210 may generate the first reference voltage VREF1 and the second reference voltage VREF2 having various levels by dropping the high voltage VH level in a stepwise manner through the plurality of unit resistances RU.

The reference voltage generating circuit 210 may include a first switch 311 and a second switch 312. The first switch 311 may be coupled between a first node N1 and a first output node ON1. The first node N1 may be coupled to one end of a first unit resistance RU1, and a first voltage may be output through the first node N1. The first reference voltage VREF1 may be output through the first output node ON1. The first switch 311 may provide the first voltage as the first reference voltage VREF1 based on the voltage setting signal SET<1:3>. For clear description, FIG. 3 illustrates the voltage setting signal SET<1:3>, received by switches of the reference voltage generating circuit 210, as a particular logic value. The second switch 312 may be coupled between a second node N2 and a second output node ON2. The first unit resistance RU1 and a second unit resistance RU2 may be coupled between the first node N1 and the second node N2. The other end of the first unit resistance RU1 may be coupled to one end of the second unit resistance RU2, and the other end of the second unit resistance RU2 may be coupled to the second node N2. A second voltage may be output through the second node N2. The second reference voltage VREF2 may be output through the second output node ON2. The second switch 312 may provide the second voltage as the second reference voltage VREF2 based on the voltage setting signal SET<1:3>.

The reference voltage generating circuit 210 may further include third to seventh switches 313, 314, 315, 316 and 317. The third switch 313 may be coupled between the second node N2 and the first output node ON1. The third switch 313 may provide the second voltage as the first reference voltage VREF1 based on the voltage setting signal SET<1:3>. The fourth switch 314 may be coupled between a third node N3 and the second output node ON2. The third unit resistance RU3 and a fourth unit resistance RU4 may be coupled between the second node N2 and the third node N3. One end of the third unit resistance RU3 may be coupled to the second node N2, the other end of the third unit resistance RU3 may be coupled to one end of the fourth unit resistance RU4, and the other end of the fourth unit resistance RU4 may be coupled to the third node N3. A third voltage may be output through the third node N3 The fourth switch 314 may provide the third voltage as the second reference voltage VREF2 based on the voltage setting signal SET<1:3>. The fifth switch 315 may be coupled between the third node N3 and the first output node ON1. The fifth switch 315 may provide the third voltage as the first reference voltage VREF1 based on the voltage setting signal SET<1:3>. The sixth switch 316 may be coupled between a fourth node N4 and the second output node ON2. The fifth unit resistance RU5 and a sixth unit resistance RU6 may be coupled between the third node N3 and the fourth node N4. One end of the fifth unit resistance RU5 may be coupled to the third node N3, the other end of the fifth unit resistance RU5 may be coupled to one end of the sixth unit resistance RU6, and the other end of the sixth unit resistance RU6 may be coupled to the fourth node N4. A fourth voltage may be output through the fourth node N4. The sixth switch 316 may provide the fourth voltage as the second reference voltage VREF2 based on the voltage setting signal SET<1:3>. The seventh switch 317 may be coupled between the fourth node N4 and the first output node ON1. The fifth switch 315 may provide the fourth voltage as the first reference voltage VREF1 based on the voltage setting signal SET<1:3>.

The second voltage may have a lower level than the first voltage by an amount of the unit level. The unit level may correspond to the level of voltage drop by the first unit resistance RU1 and the second unit resistance RU2. The third voltage may have a lower level than the second voltage by an amount of the unit level. The unit level may correspond to the level of voltage drop by the third unit resistance RU3 and the fourth unit resistance RU4. The fourth voltage may have a lower level than the third voltage by an amount of the unit level. The unit level may correspond to the level of voltage drop by the fifth unit resistance RU5 and the sixth unit resistance RU6.

The reference voltage generating circuit 210 may simultaneously turn on at least two switches based on the voltage setting signal SET<1:3>, and may determine the target reference voltage VT based on the first reference voltage VREF1 and the second reference voltage VREF2, which are output through the simultaneously turned on switches. A level of the target reference voltage VT may be obtained by summing up the first reference voltage VREF1 and the second reference voltage VREF2 and by dividing the sum by two. For example, when the voltage setting signal SET<1:3> has a first logic value "000", the reference voltage generating circuit 210 may simultaneously turn on the first switch 311 and the second switch 312; may generate the first reference voltage VREF1 from the first voltage; and may generate the second reference voltage VREF2 from the second voltage. Therefore, the target reference voltage VT may have a level corresponding to a middle level between the voltage levels of the first node N1 and the second node N2. For example, when the voltage setting signal SET<1:3> has a second logic value "001", the reference voltage generating circuit 210 may simultaneously turn on the second switch 312 and the third switch 313; and may generate the first reference voltage VREF1 and the second reference voltage VREF2 from the second voltage. Therefore, the target reference voltage VT may have a level corresponding to the voltage level of the second node N2.

For example, when the voltage setting signal SET<1:3> has a third logic value "010", the reference voltage generating circuit 210 may simultaneously turn on the third switch 313 and the fourth switch 314; and may generate the first reference voltage VREF1 from the second voltage and the second reference voltage VREF2 from the third voltage. Therefore, the target reference voltage VT may have a level corresponding to a middle level between the voltage levels of the second node N2 and the third node N3. For example, when the voltage setting signal SET<1:3> has a fourth logic value "011", the reference voltage generating circuit 210 may simultaneously turn on the fourth switch 314 and the fifth switch 315; and may generate the first reference voltage VREF1 and the second reference voltage VREF2 from the third voltage. Therefore, the target reference voltage VT may have a level corresponding to the voltage level of the third node N3.

For example, when the voltage setting signal SET<1:3> has a fifth logic value "100", the reference voltage generating circuit 210 may simultaneously turn on the fifth switch 315 and the sixth switch 316; and may generate the first reference voltage VREF1 from the third voltage and the second reference voltage VREF2 from the fourth voltage. Therefore, the target reference voltage VT may have a level corresponding to a middle level between the voltage levels of the third node N3 and the fourth node N4. For example, when the voltage setting signal SET<1:3> has a sixth logic value "101", the reference voltage generating circuit 210 may simultaneously turn on the sixth switch 316 and the seventh switch 317; and may generate the first reference voltage VREF1 and the second reference voltage VREF2 from the fourth voltage. Therefore, the target reference voltage VT may have a level corresponding to the voltage level of the fourth node N4.

Figure 4:
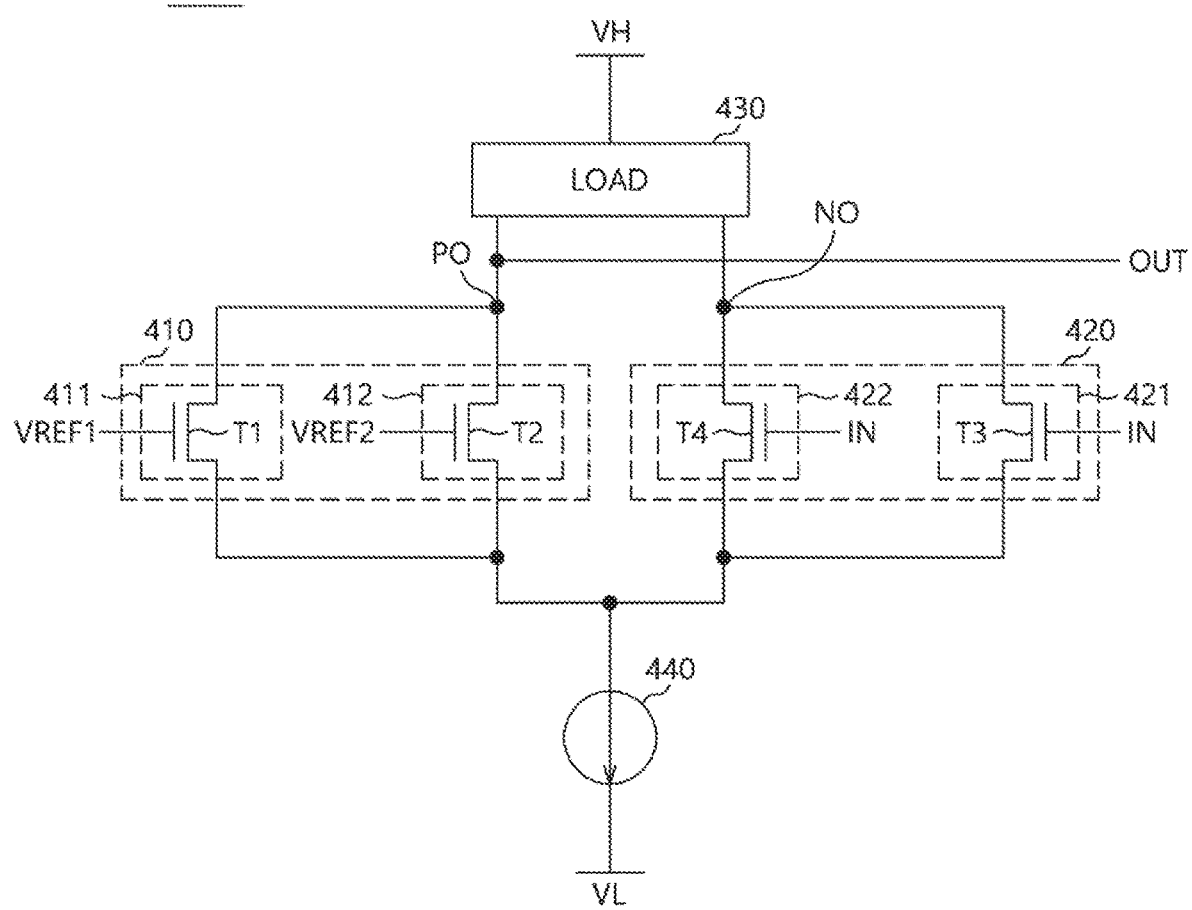
FIG. 4 is a diagram illustrating a configuration of a buffer illustrated in FIG. 2.

FIG. 4 is a diagram illustrating a configuration of the buffer 220 illustrated in FIG. 2. Referring to FIG. 4, the buffer 220 may include a first differential input portion 410 and a second differential input portion 420. The first differential input portion 410 may be coupled between the high voltage VH node and the low voltage VL node. The first differential input portion 410 may receive the first reference voltage VREF1 and the second reference voltage VREF2, and may change a voltage level of a positive output node PO based on the first reference voltage VREF1 and the second reference voltage VREF2. The second differential input portion 420 may be coupled between the high voltage VH node and the low voltage VL node. The second differential input portion 420 may receive the input signal IN, and may change a voltage level of a negative output node NO based on the input signal IN. The output signal OUT may be generated from the positive output node PO. The buffer 220 may output, when the input signal IN has a higher level than the target reference voltage VT of the buffer 220, a signal having a high level through the positive output node PO. The buffer 220 may output, when the input signal IN has a lower level than the target reference voltage VT of the buffer 220, a signal having a low level through the positive output node PO. The target reference voltage VT of the buffer 220 may be determined from the first reference voltage VREF1 and the second reference voltage VREF2, as described with reference to FIG. 3.

The first differential input portion 410 may include a first input section 411 and a second input section 412. The first input section 411 may receive the first reference voltage VREF1, and may change the voltage level of the positive output node PO based on the first reference voltage VREF1. The second input section 412 may receive the second reference voltage VREF2, and may change the voltage level of the positive output node PO based on the second reference voltage VREF2. The second differential input portion 420 may include a third input section 421. The third input section 421 may receive the input signal IN, and may change the voltage level of the negative output node NO based on the input signal IN. The second differential input portion 420 may further include a fourth input section 422. The fourth input section 422 may receive the input signal IN, and may change the voltage level of the negative output node NO based on the input signal IN. The fourth input section 422 may serve as a dummy input section of the second differential input portion 420 since the first differential input portion 410 has two input sections 411 and 412. The second differential input portion 420 may control loading of the positive output node PO and loading of the negative output node NO to be substantially the same as each other through the fourth input section 422. Therefore, the buffer 220 may generate the output signal OUT precisely although amplifying the input signal IN by using the two reference voltages.

The buffer 220 may further include a load 430 and a current source 440. The load 430 may be coupled between the high voltage VH node and the first differential input portion 410 and the second differential input portion 420. The load 430 may couple the high voltage VH node to each of the positive output node PO and the negative output node NO. The load 430 may be a passive resistance load or a load configured in a form of a current mirror. The current source 440 may be coupled between the first differential input portion 410 and the second differential input portion 420 and the low voltage VL node. The current source 440 may form a current path running from the first differential input portion 410 and the second differential input portion 420 to the low voltage VL node.

The first input section 411 may include a first transistor T1. The first transistor T1 may be a N-type channel MOS transistor. The first transistor T1 may receive the first reference voltage VREF1 at its gate, may be coupled to the positive output node PO at its drain, and may be coupled to the current source 440 at its source. The second input section 412 may include a second transistor T2. The second transistor T2 may be a N-type channel MOS transistor. The second transistor T2 may receive the second reference voltage VREF2 at its gate, may be coupled to the positive output node PO at its drain, and may be coupled to the current source 440 at its source. The third input section 421 may include a third transistor T3. The third transistor T3 may be a N-type channel MOS transistor. The third transistor T3 may receive the input signal IN at its gate, may be coupled to the negative output node NO at its drain, and may be coupled to the current source 440 at its source. The fourth input section 422 may include a fourth transistor T4. The fourth transistor T4 may be a N-type channel MOS transistor. The fourth transistor T4 may receive the input signal IN at its gate, may be coupled to the negative output node NO at its drain, and may be coupled to the current source 440 at its source. When the second differential input portion 420 includes only the third input section 421, a size of the third transistor T3 may be double a size of the first transistor T1 or the second transistor T2. When the second differential input portion 420 includes both the third input section 421 and the fourth input section 422, sizes of the first to fourth transistors T1, T2, T3 and T4 may be the same as one another.

Hereinafter, described with reference to FIGS. 2 to 4 will be an operation of the semiconductor apparatus 200 in accordance with an embodiment of the present disclosure. For example, when the reference voltage decoder 230 generates the voltage setting signal SET<1:3> having a logic value "000" based on the address signal A<1:n>, the first switch 311 and the second switch 312 may be simultaneously turned on. The first voltage, which is the voltage level of the first node N1, may be provided as the first reference voltage VREF1 and the second voltage, which is the voltage level of the second node N2, may be provided as the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level be a middle level between the first voltage and the second voltage. That is, the target reference voltage VT of the buffer 220 may correspond to the voltage level between the first unit resistance RU1 and the second unit resistance RU2.

For example, when the reference voltage decoder 230 generates the voltage setting signal SET<1:3> having a logic value "001" based on the address signal A<1:n>, the second switch 312 and the third switch 313 may be simultaneously turned on. The second voltage, which is the voltage level of the second node N2, may be provided as each of the first reference voltage VREF1 and the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level of the second voltage. That is, the target reference voltage VT of the buffer 220 may correspond to the voltage level between the second unit resistance RU2 and the third unit resistance RU3.

For example, when the reference voltage decoder 230 generates the voltage setting signal SET<1:3> having a logic value "010" based on the address signal A<1:n>, the third switch 313 and the fourth switch 314 may be simultaneously turned on. The second voltage, which is the voltage level of the second node N2, may be provided as the first reference voltage VREF1 and the third voltage, which is the voltage level of the third node N3, may be provided as the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level be a middle level between the second voltage and the third voltage. That is, the target reference voltage VT of the buffer 220 may correspond to the voltage level between the third unit resistance RU3 and the fourth unit resistance RU4.

For example, when the reference voltage decoder 230 generates the voltage setting signal SET<1:3> having a logic value "011" based on the address signal A<1:n>, the fourth switch 314 and the fifth switch 315 may be simultaneously turned on. The third voltage, which is the voltage level of the third node N3, may be provided as each of the first reference voltage VREF1 and the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level of the third voltage. That is, the target reference voltage VT of the buffer 220 may correspond to the voltage level between the fourth unit resistance RU4 and the fifth unit resistance RU5.

For example, when the reference voltage decoder 230 generates the voltage setting signal SET<1:3> having a logic value "100" based on the address signal A<1:n>, the fifth switch 315 and the sixth switch 316 may be simultaneously turned on. The third voltage, which is the voltage level of the third node N3, may be provided as the first reference voltage VREF1 and the fourth voltage, which is the voltage level of the fourth node N4, may be provided as the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level be a middle level between the third voltage and the fourth voltage. That is, the target reference voltage VT of the buffer 220 may correspond to the voltage level between the fifth unit resistance RU5 and the sixth unit resistance RU6.

For example, when the reference voltage decoder 230 generates the voltage setting signal SET<1:3> having a logic value "101" based on the address signal A<1:n>, the sixth switch 316 and the seventh switch 317 may be simultaneously turned on. The fourth voltage, which is the voltage level of the fourth node N4, may be provided as each of the first reference voltage VREF1 and the second reference voltage VREF2. The buffer 220 may receive the first reference voltage VREF1 and the second reference voltage VREF2, and may generate the output signal OUT by amplifying a level of the input signal IN with a level of the target reference voltage VT, which is determined according to the first reference voltage VREF1 and the second reference voltage VREF2. The target reference voltage VT of the buffer 220 may have a voltage level of the fourth voltage. That is, the target reference voltage VT of the buffer 220 may correspond to the voltage level between the sixth unit resistance RU6 and the seventh unit resistance RU7.

The reference voltage generating circuit 210 may generate two reference voltages through two output nodes based on the voltage setting signal SET<1:3>. Therefore, the time required for the level of the target reference voltage of the buffer 220 to be settled may be reduced and the buffer 220 may generate the output signal OUT by promptly and precisely amplifying the input signal IN.

Figure 5:
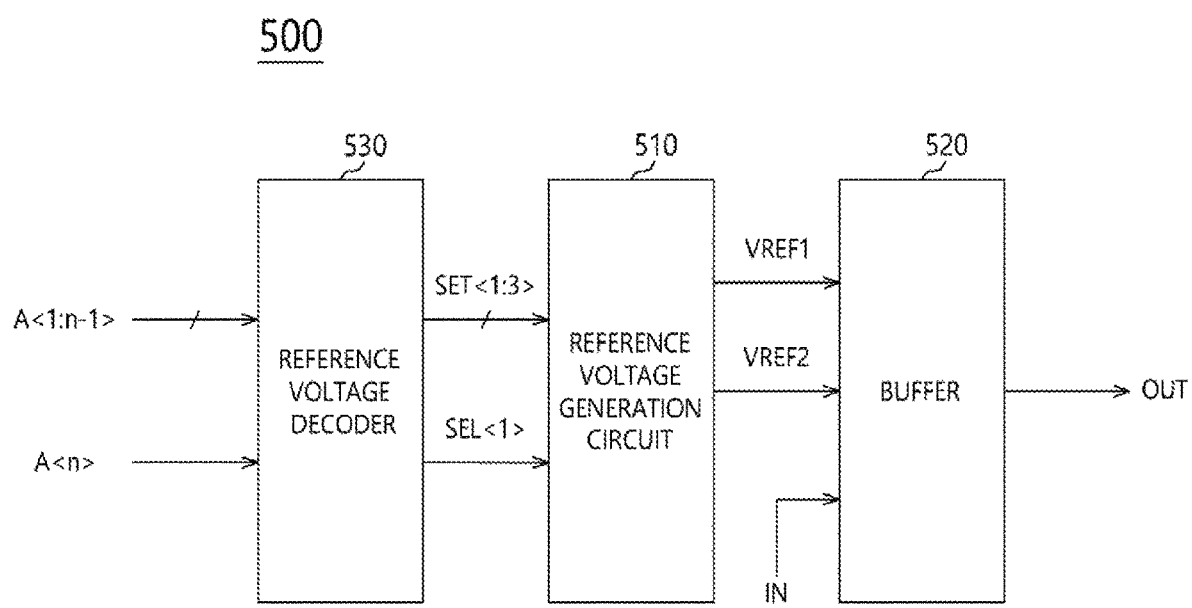
FIG. 5 is a diagram illustrating a configuration of a semiconductor apparatus in accordance with an embodiment.

FIG. 5 is a diagram illustrating a configuration of a semiconductor apparatus 500 in accordance with an embodiment. Referring to FIG. 5, the semiconductor apparatus 500 may include a reference voltage generating circuit 510 and a buffer 520. The reference voltage generating circuit 510 may be applied as the reference voltage generating circuit 115 or the reference voltage generating circuit 125 described with reference to FIG. 1. The buffer 520 may be applied as the external signal receiver 112, the external signal receiver 122 or the internal signal receiver 124 described with reference to FIG. 1. The reference voltage generating circuit 510 may receive a voltage setting signal SET<1:3>, and may generate a first reference voltage VREF1 and a second reference voltage VREF2 based on the voltage setting signal SET<1:3>. The reference voltage generating circuit 510 may select one among voltages of a first range based on the voltage setting signal SET<1:3> and generate the selected voltage as the first reference voltage VREF1. The reference voltage generating circuit 510 may select one among voltages of a second range based on the voltage setting signal SET<1:3> and generate the selected voltage as the second reference voltage VREF2. The second range may overlap, partially or as a whole, with the first range. The reference voltage generating circuit 510 may receive a voltage selection signal SEL<1>, and may selectively output one between the first reference voltage VREF1 and the second reference voltage VREF2 based on the voltage selection signal SEL<1>.

The reference voltage generating circuit 510 may disable either the first reference voltage VREF1 or the second reference voltage VREF2 based on the voltage selection signal SEL<1>. Although the configuration illustrates that the reference voltage generating circuit 510 is a 4-bit reference voltage generating circuit, the present invention will not be limited thereto. A number of bits of the voltage setting signal for selecting the first reference voltage VREF1 and the second reference voltage VREF2 generated by the reference voltage generating circuit 210 may vary. The buffer 520 may receive the first reference voltage VREF1, the second reference voltage VREF2 and the input signal IN, and may generate the output signal OUT. The buffer 520 may generate the output signal OUT by amplifying a level of the input signal IN with a level of either the first reference voltage VREF1 or the second reference voltage VREF2.

The semiconductor apparatus 500 may further include a reference voltage decoder 530. The reference voltage decoder 530 may receive an address signal A<1:n>, and may generate the voltage setting signal SET<1:3> and the voltage selection signal SEL<1>. The reference voltage decoder 530 may generate the voltage setting signal SET<1:3> by decoding at least a part of the address signal A<1:n>. For example, the address signal A<1:n> may have "n" number of bits, and the reference voltage decoder 530 may generate the voltage setting signal SET<1:3> by decoding first to $(n-1)^{th}$ bits (i.e., address signal A<1:n-1>) of the address signal A<1:n>. For example, the reference voltage decoder 530 may generate the voltage setting signal having (2n+1) number of different logic values according to the address signal A<1:n-1>. According to the number of bits of the voltage setting signal, all or part of the (2n-1) number of different logic values may be used. The reference voltage decoder 530 may generate the voltage selection signal SEL<1> based on at least one bit of the address signal A<1:n>. For example, the reference voltage decoder 530 may use the $n^{th}$ bit (i.e., A<n>) of the address signal A<1:n> as the voltage selection signal SEL<1>. The reference voltage decoder 530 may generate two reference voltages having the same level as each other or different levels from each other based on the voltage setting signal SET<1:3>, which is generated from the at least a part of the address signal A<1:n>, and may select and use one of the two reference voltages based on the voltage selection signal SEL<1>, which is generated from the at least one bit of the address signal A<1:n>, thereby reducing a number of bits of the address signal A<1:n> to generate the reference voltages and reducing a circuit space of the reference voltage decoder 530. In an embodiment, the reference voltage decoder 530 may be included in the reference voltage generating circuit 510 as an element thereof.

Figure 6:
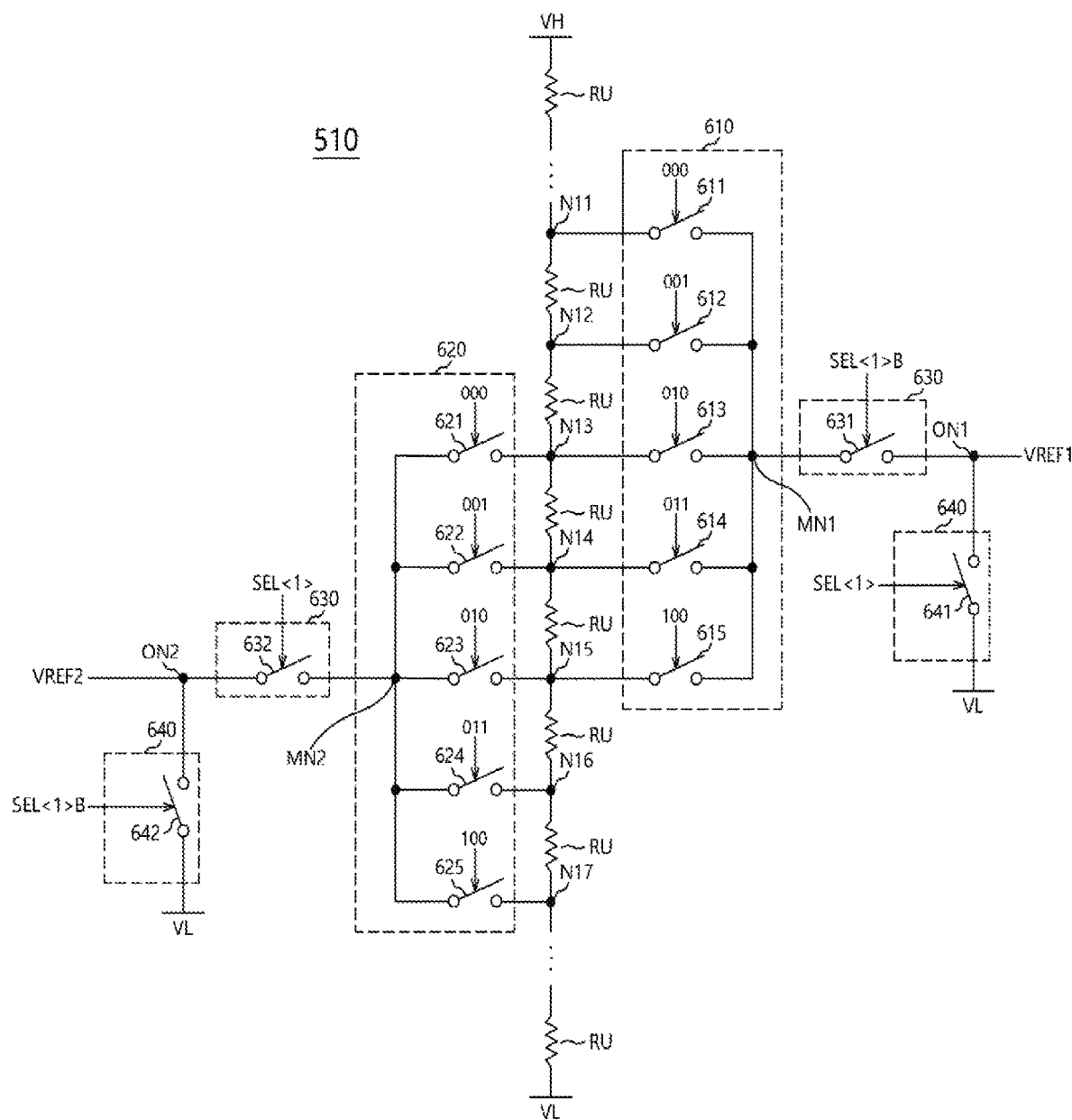
FIG. 6 is a diagram illustrating a configuration of a reference voltage generating circuit illustrated in FIG. 5.

FIG. 6 is a diagram illustrating a configuration of the reference voltage generating circuit 510 illustrated in FIG. 5. Referring to FIG. 6, the reference voltage generating circuit 510 may include a first voltage generation portion 610, a second voltage generation portion 620 and an output selection portion 630. The first voltage generation portion 610 may output one among the voltages of the first range as the first reference voltage VREF1 based on the voltage setting signal SET<1:3>. The second voltage generation portion 620 may output one among the voltages of the second range as the second reference voltage VREF2 based on the voltage setting signal SET<1:3>. The output selection portion 630 may selectively output one of the first reference voltage VREF1 and the second reference voltage VREF2 based on the voltage selection signal SEL<1>.

The reference voltage generating circuit 510 may further include a disable portion 640. In an embodiment, the output selection portion 630 may be replaced with the disable portion 640 in the reference voltage generating circuit 510. In an embodiment, the reference voltage generating circuit 510 may include both the output selection portion 630 and the disable portion 640. The disable portion 640 may disable the unselected one of the first reference voltage VREF1 and the second reference voltage VREF2. For example, the disable portion 640 may drive the node, which outputs the unselected one of the first reference voltage VREF1 and the second reference voltage VREF2, with a disable voltage. The disable voltage may correspond to the low voltage VL.

Referring to FIG. 6, the reference voltage generating circuit 510 may include a plurality of unit resistances RU. The plurality of unit resistances RU may be serially coupled to each other between a high voltage VH node and a low voltage VL node. The first voltage generation portion 610 may be coupled between a first node N11 and a fifth node N15. A unit resistance RU may be coupled between the first node N11 and a second node N12, between the second node N12 and a third node N13, between the third node N13 and a fourth node N14, and between the fourth node N14 and the fifth node N15. A first voltage may be output through the first node N11, a second voltage may be output through the second node N12, a third voltage may be output through the third node N13, a fourth voltage may be output through the fourth node N14 and a fifth voltage may be output through the fifth node N15. The second voltage may have a lower level than the first voltage by an amount of the unit level. The level difference between the first voltage and the second voltage may correspond to a level of voltage drop by a single unit resistance RU. The third voltage may have a lower level than the second voltage by an amount of the unit level. The level difference between the second voltage and the third voltage may correspond to a level of voltage drop by a single unit resistance RU. The fourth voltage may have a lower level than the third voltage by an amount of the unit level. The level difference between the third voltage and the fourth voltage may correspond to a level of voltage drop by a single unit resistance RU. The fifth voltage may have a lower level than the fourth voltage by an amount of the unit level. The level difference between the fourth voltage and the fifth voltage may correspond to a level of voltage drop by a single unit resistance RU. The first voltage generation portion 610 may select one among the first to fifth voltages as the first reference voltage VREF1 based on the voltage setting signal SET<1:3>.

The first voltage generation portion 610 may include a first switch 611, a second switch 612, a third switch 613, a fourth switch 614 and a fifth switch 615. The first switch 611 may be coupled between the first node N11 and a first middle node MN1, and may output the first voltage through the first middle node MN1 based on the voltage setting signal SET<1:3> having a logic value "000". For clear description, FIG. 6 illustrates the voltage setting signal SET<1:3>, received by switches of the reference voltage generating circuit 210, as a particular logic value. The second switch 612 may be coupled between the second node N12 and the first middle node MN1, and may output the second voltage through the first middle node MN1 based on the voltage setting signal SET<1:3> having a logic value "001". The third switch 613 may be coupled between the third node N13 and the first middle node MN1, and may output the third voltage through the first middle node MN1 based on the voltage setting signal SET<1:3> having a logic value "010". The fourth switch 614 may be coupled between the fourth node N14 and the first middle node MN1, and may output the fourth voltage through the first middle node MN1 based on the voltage setting signal SET<1:3> having a logic value "011". The fifth switch 615 may be coupled between the fifth node N15 and the first middle node MN1, and may output the fifth voltage through the first middle node MN1 based on the voltage setting signal SET<1:3> having a logic value "100".

The second voltage generation portion 620 may be coupled between the third node N13 and a seventh node N17. A unit resistance RU may be coupled between the fifth node N15 and a sixth node N16 and between the sixth node N16 and the seventh node N17. A sixth voltage may be output through the sixth node N16 and a seventh voltage may be output through the seventh node N17. The sixth voltage may have a lower level than the fifth voltage by an amount of the unit level. The level difference between the fifth voltage and the sixth voltage may correspond to a level of voltage drop by a single unit resistance RU. The seventh voltage may have a lower level than the sixth voltage by an amount of the unit level. The level difference between the sixth voltage and the seventh voltage may correspond to a level of voltage drop by a single unit resistance RU. The second voltage generation portion 620 may select one among the third to seventh voltages as the second reference voltage VREF2 based on the voltage setting signal SET<1:3>.

The second voltage generation portion 620 may include a first switch 621, a second switch 622, a third switch 623, a fourth switch 624 and a fifth switch 625. The first switch 621 may be coupled between the third node N13 and a second middle node MN2, and may output the third voltage through the second middle node MN2 based on the voltage setting signal SET<1:3> having a logic value "000". The second switch 622 may be coupled between the fourth node N14 and the second middle node MN2, and may output the fourth voltage through the second middle node MN2 based on the voltage setting signal SET<1:3> having a logic value "001". The third switch 623 may be coupled between the fifth node N15 and the second middle node MN2, and may output the fifth voltage through the second middle node MN2 based on the voltage setting signal SET<1:3> having a logic value "010". The fourth switch 624 may be coupled between the sixth node N16 and the second middle node MN2, and may output the sixth voltage through the second middle node MN2 based on the voltage setting signal SET 1:3> having a logic value "011". The fifth switch 625 may be coupled between the seventh node N17 and the second middle node MN2, and may output the seventh voltage through the second middle node MN2 based on the voltage setting signal SET 1:3> having a logic value "100".

The output selection portion 630 may include a first switch 631 and a second switch 632. The first switch 631 may be coupled between the first middle node MN1 and the first output node ON1. The first switch 631 may couple the first middle node MN1 and the first output node ON1 to each other based on the voltage selection signal SEL<1>. For example, the first switch 631 may be turned on by receiving a complementary signal SEL<1>B of the voltage selection signal SEL<1>. The first switch 631 may output the voltage generated from the first voltage generation portion 610 as the first reference voltage VREF1. The second switch 632 may be coupled between the second middle node MN2 and the second output node ON2. The second switch 632 may couple the second middle node MN2 and the second output node ON2 to each other based on the voltage selection signal SEL<1>. For example, the second switch 632 may be turned on by receiving the voltage selection signal SEL<1>. The second switch 632 may output the voltage generated from the second voltage generation portion 620 as the second reference voltage VREF2.

The disable portion 640 may include a first switch 641 and a second switch 642. The first switch 641 may be coupled between the first output node ON1 and the low voltage VL node. The first switch 641 may couple the first output node ON1 and the low voltage VL node to each other based on the voltage selection signal SEL<1>. For example, the first switch 641 may be turned on by receiving the voltage selection signal SEL<1>. The first switch 641 may disable the first reference voltage VREF1 by driving the first output node ON1 to the low voltage VL. The second switch 642 may be coupled between the second output node ON2 and the low voltage VL node. The second switch 642 may couple the second output node ON2 and the low voltage VL node to each other based on the voltage selection signal SEL<1>. For example, the second switch 642 may be turned on by receiving the complementary signal SEL<1>B of the voltage selection signal SEL<1>. The second switch 642 may disable the second reference voltage VREF2 by driving the second output node ON2 to the low voltage VL.

Figure 7:
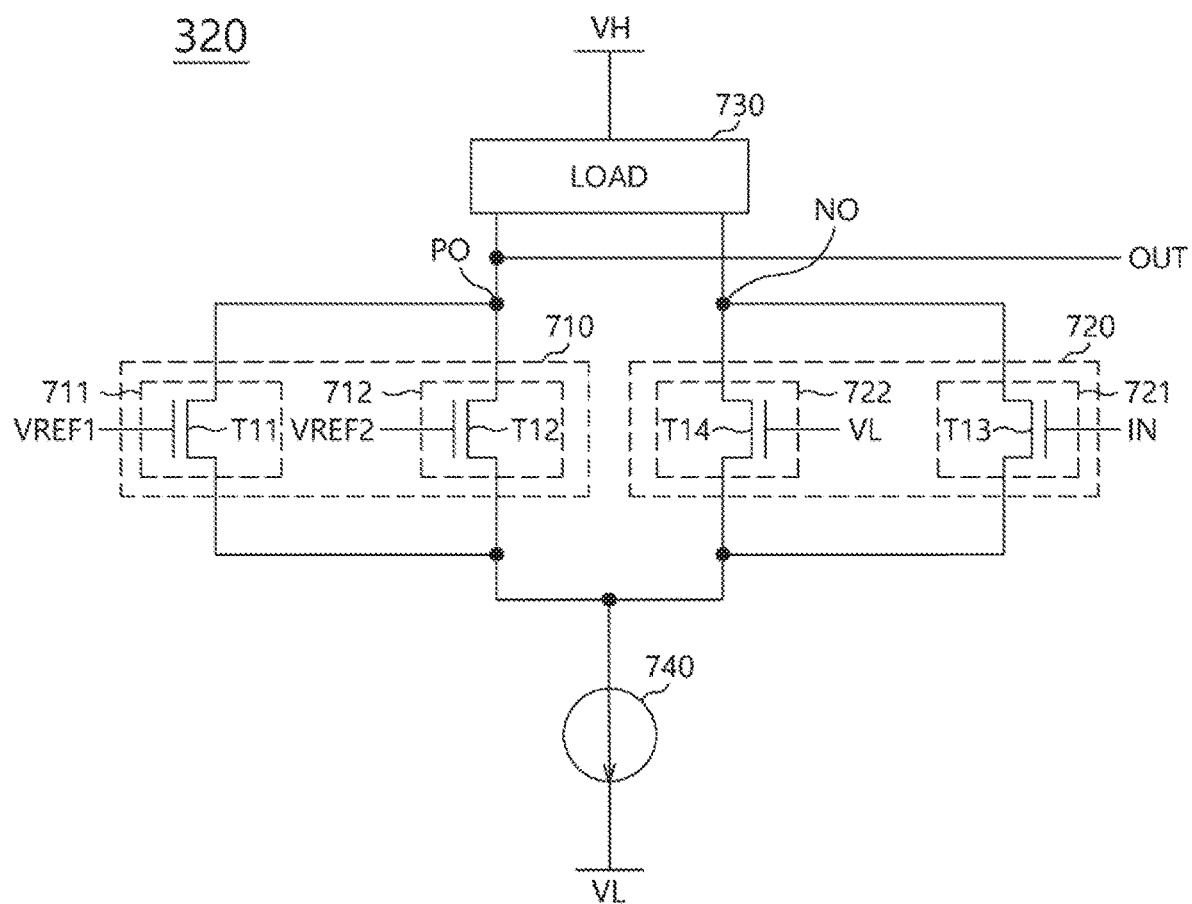
FIG. 7 is a diagram illustrating a configuration of a buffer illustrated in FIG. 5.

FIG. 7 is a diagram illustrating a configuration of the buffer 520 illustrated in FIG. 5. Referring to FIG. 7, the buffer 520 may include a first differential input portion 710 and a second differential input portion 720. The first differential input portion 710 may be coupled between the high voltage VH node and the low voltage VL node. The first differential input portion 710 may receive the first reference voltage VREF1 and the second reference voltage VREF2, and may change a voltage level of a positive output node PO based on the first reference voltage VREF1 and the second reference voltage VREF2. The second differential input portion 720 may be coupled between the high voltage VH node and the low voltage VL node. The second differential input portion 420 may receive the input signal IN, and may change a voltage level of a negative output node NO based on the input signal IN. The output signal OUT may be generated from the positive output node PO.

The first differential input portion 710 may include a first input section 711 and a second input section 712. The first input section 711 may receive the first reference voltage VREF1, and may change the voltage level of the positive output node PO based on the first reference voltage VREF1.

The second input section 712 may receive the second reference voltage VREF2, and may change the voltage level of the positive output node PO based on the second reference voltage VREF2. The second differential input portion 720 may include a third input section 721. The third input section 721 may receive the input signal IN, and may change the voltage level of the negative output node NO based on the input signal IN. The second differential input portion 720 may further include a fourth input section 722. The fourth input section 722 may receive the low voltage VL, and may be coupled to the negative output node NO. When one of the first reference voltage VREF1 and the second reference voltage VREF2 is selected by the reference voltage generating circuit 510, the unselected one of the first reference voltage VREF1 and the second reference voltage VREF2 may be disabled to the low voltage VL. Therefore, the fourth input section 722 may control loading of the first differential input portion 710 and loading of the second differential input portion 720 to be substantially the same as each other by receiving the low voltage VL.

The buffer 520 may further include a load 730 and a current source 740. The load 730 may be coupled between the high voltage VH node and the first differential input portion 710 and the second differential input portion 720. The load 730 may couple the high voltage VH node to each of the positive output node PO and the negative output node NO. The load 730 may be a passive resistance load or a load configured in a form of a current mirror. The current source 740 may be coupled between the first differential input portion 710 and the second differential input portion 720 and the low voltage VL node. The current source 740 may form a current path running from the first differential input portion 710 and the second differential input portion 720 to the low voltage VL node.

The first input section 711 may include a first transistor T11. The first transistor T11 may be a N-type channel MOS transistor. The first transistor T11 may receive the first reference voltage VREF1 at its gate, may be coupled to the positive output node PO at its drain, and may be coupled to the current source 740 at its source. The second input section 712 may include a second transistor T12. The second transistor T12 may be a N-type channel MOS transistor. The second transistor T12 may receive the second reference voltage VREF2 at its gate, may be coupled to the positive output node PO at its drain, and may be coupled to the current source 740 at its source. The third input section 721 may include a third transistor T13. The third transistor T13 may be a N-type channel MOS transistor. The third transistor T13 may receive the input signal IN at its gate, may be coupled to the negative output node NO at its drain, and may be coupled to the current source 740 at its source. The fourth input section 722 may include a fourth transistor T14. The fourth transistor T14 may be a N-type channel MOS transistor. The fourth transistor T14 may receive the low voltage VL at its gate, may be coupled to the negative output node NO at its drain, and may be coupled to the current source 740 at its source. When the second differential input portion 720 includes only the third input section 721, a size of the third transistor T13 may be double a size of the first transistor T11 or the second transistor T12. When the second differential input portion 720 includes both the third input section 721 and the fourth input section 722, sizes of the first to fourth transistors T11, T12, T13 and T14 may be the same as one another.

Hereinafter, described with reference to FIGS. 5 to 7 will be an operation of the semiconductor apparatus 500 in accordance with an embodiment of the present disclosure.

For example, when the reference voltage decoder 530 generates the voltage setting signal SET<1:3> having a logic value "000" based on the address signal A<1:n−1>, the first switch 611 of the first voltage generation portion 610 and the first switch 621 of the second voltage generation portion 620 may be simultaneously turned on. Therefore, the first node N11 may be coupled to the first middle node MN1 and thus the first voltage may be provided to the first middle node MN1; and the third node N13 may be coupled to the second middle node MN2 and thus the third voltage may be provided to the second middle node MN2. At this time, when the reference voltage decoder 530 generates the voltage selection signal SEL<1> having a high level based on the address signal A<n>, the second switch 632 of the output selection portion 630 may be turned on while the first switch 631 of the output selection portion 630 may be turned off. Therefore, the second middle node MN2 may be coupled to the second output node ON2 and the third voltage may be output as the second reference voltage VREF2. The first switch 641 of the disable portion 640 may be turned on while the second switch 642 of the disable portion 640 may be turned off, based on the voltage selection signal SEL<1>. The first switch 641 of the disable portion 640 may drive the first output node ON1 to the low voltage VL and may disable the first reference voltage VREF1 to a level of the low voltage VL.

The first input section 711 may receive the first reference voltage VREF1, which is disabled to have a level of the low voltage VL, and the second input section 712 may receive the second reference voltage VREF2 having a level of the third voltage. The third input section 721 may receive the input signal IN. The fourth input section 722 may receive the low voltage VL, and may be turned off. Therefore, the second input section 712 and the third input section 721 may generate the output signal OUT by amplifying a level of the input signal IN with a level of the second reference voltage VREF2. The first input section 711 and the fourth input section 722 may receive the low voltage VL and may be turned off, and therefore the loading of the positive output node PO and the loading of the negative output node NO may be the same as each other.

For example, when the reference voltage decoder 530 generates the voltage setting signal SET<1:3> having a logic value "100" based on the address signal A<1:n−1>, the fifth switch 615 of the first voltage generation portion 610 and the fifth switch 625 of the second voltage generation portion 620 may be simultaneously turned on. Therefore, the fifth node N15 may be coupled to the first middle node MN1 and thus the fifth voltage may be provided to the first middle node MN1; and the seventh node N17 may be coupled to the second middle node MN2 and thus the seventh voltage may be provided to the second middle node MN2. At this time, when the reference voltage decoder 530 generates the voltage selection signal SEL<1> having a low level based on the address signal A<n>, the first switch 631 of the output selection portion 630 may be turned on while the second switch 632 of the output selection portion 630 may be turned off. Therefore, the first middle node MN1 may be coupled to the first output node ON1 and the fifth voltage may be output as the first reference voltage VREF1. The second switch 642 of the disable portion 640 may be turned on while the first switch 641 of the disable portion 640 may be turned off, based on the voltage selection signal SEL<1>. The second switch 642 of the disable portion 640 may drive the second output node ON2 to the low voltage VL and may disable the second reference voltage VREF2 to a level of the low voltage VL.

The first input section 711 may receive the first reference voltage VREF1 having a level of the seventh voltage, and the second input section 712 may receive the second reference voltage VREF2, which is disabled to have a level of the low voltage VL. The third input section 721 may receive the input signal IN. The fourth input section 722 may receive the low voltage VL, and may be turned off. Therefore, the first input section 711 and the third input section 721 may generate the output signal OUT by amplifying a level of the input signal IN with a level of the first reference voltage VREF1. The second input section 712 and the fourth input section 722 may receive the low voltage VL and may be turned off, and therefore the loading of the positive output node PO and the loading of the negative output node NO may be the same as each other.

While certain embodiments have been described above, it will be understood to those skilled in the art that the embodiments described are by way of example only. Accordingly, the reference voltage generating circuit, buffer, semiconductor apparatus, and semiconductor system using the same should not be limited based on the described embodiments. Rather, the reference voltage generating circuit, buffer, semiconductor apparatus, and semiconductor system using the same described herein should only be limited in light of the claims that follow when taken in conjunction with the above description and accompanying drawings.

What is claimed is:

1. A semiconductor apparatus comprising:
   a reference voltage generating circuit configured to generate, based on a voltage setting signal, a first reference voltage and a second reference voltage having the same level as the first reference voltage or having a lower level than the first reference voltage by an amount of a unit level; and
   a buffer configured to generate an output signal based on an input signal and a target reference voltage determined by the first reference voltage and the second reference voltage,
   wherein the reference voltage generating circuit includes:
   a first switch configured to output a first voltage as the first reference voltage based on the voltage setting signal having a first code value;
   a second switch configured to output a second voltage as the second reference voltage based on the voltage setting signal having the first code value or a second code value; and
   a third switch configured to output the second voltage as the first reference voltage based on the voltage setting signal having the second code value,
   wherein the second voltage has a lower level than the first voltage by an amount of the unit level.

2. The semiconductor apparatus of claim 1, further comprising a reference voltage decoder configured to generate the voltage setting signal based on an address signal.

3. A semiconductor apparatus comprising:
   a reference voltage generating circuit configured to generate, based on a voltage setting signal, a first reference voltage and a second reference voltage having the same level as the first reference voltage or having a lower level than the first reference voltage by an amount of a unit level; and
   a buffer configured to generate an output signal based on an input signal and a target reference voltage determined by the first reference voltage and the second reference voltage,
   wherein the reference voltage generating circuit includes:
   a plurality of unit resistances serially coupled to each other between a high voltage node and a low voltage node, the high voltage having a higher level than the low voltage;
   a first switch configured to output a first voltage through one end of a first unit resistance as the first reference voltage based on the voltage setting signal; and
   a second switch configured to output a second voltage through an end of a second unit resistance, an other end of the second unit resistance being coupled to an other end of the first unit resistance, as the second reference voltage based on the voltage setting signal,
   wherein the first unit resistance and the second unit resistance are configured to be between the first switch and the second switch.

4. The semiconductor apparatus of claim 3, wherein a voltage drop by each of the first and second unit resistances corresponds to the unit level.

5. The semiconductor apparatus of claim 3, wherein the reference voltage generating unit further includes:
   a third switch configured to output the second voltage, which is output through one end of a third unit resistance, the third unit resistance being coupled to the end of the second unit resistance, as the first reference voltage based on the voltage setting signal; and
   a fourth switch configured to output the third voltage, which is output through an end of a fourth unit resistance, an other end of the fourth unit resistance being coupled to an other end of the third unit resistance, as the second reference voltage based on the voltage setting signal,
   wherein the third unit resistance and the fourth unit resistance are configured to be between the third switch and the fourth switch.

6. A semiconductor apparatus comprising:
   a reference voltage generating circuit configured to generate, based on a voltage setting signal, a first reference voltage and a second reference voltage having the same level as the first reference voltage or having a lower level than the first reference voltage by an amount of a unit level; and
   a buffer configured to generate an output signal based on an input signal and a target reference voltage determined by the first reference voltage and the second reference voltage,
   wherein the buffer includes:
   a first differential input portion coupled between a high voltage node and a low voltage node, and configured to change a voltage level of a positive output node based on the first reference voltage and the second reference voltage; and
   a second differential input portion coupled between the high voltage node and the low voltage node, and configured to change a voltage level of a negative output node based on the input signal, and
   wherein the output signal is generated from the positive output node.

7. The semiconductor apparatus of claim 6, wherein the first differential input portion includes:
   a first input section configured to change the voltage level of the positive output node based on the first reference voltage; and
   a second input section configured to change the voltage level of the positive output node based on the second reference voltage.

8. The semiconductor apparatus of claim 6, wherein the second differential input portion includes a third input section configured to change the voltage level of the negative output node based on the input signal.

9. The semiconductor apparatus of claim 8, wherein the second differential input portion further includes a fourth input section configured to change the voltage level of the negative output node based on the input signal.

10. The semiconductor apparatus of claim 6, wherein the buffer is configured to calculate the target reference voltage and configured to generate the output signal by amplifying a level of the input signal with a level of the target reference voltage.

11. The semiconductor apparatus of claim 10, wherein the target reference voltage is a middle level between the first reference voltage and the second reference voltage.

12. A semiconductor apparatus comprising:
a reference voltage generating circuit configured to generate, based on a voltage setting signal, a first reference voltage and a second reference voltage, and to output one of the first reference voltage and the second reference voltage based on a voltage selection signal; and
a buffer configured to generate an output signal based on the first reference voltage, the second reference voltage and an input signal,
wherein the reference voltage generating circuit includes:
a first voltage generation portion configured to output, as the first reference voltage, one among first to $n^{th}$ voltages of a first range, between a high voltage and a low voltage, the low voltage having a lower level than the high voltage, based on the voltage setting signal, the n being an integer equal to or greater than 3;
a second voltage generation portion configured to output, as the second reference voltage, one among $m^{th}$ to $(m+n)^{th}$ voltages of a second range, between the high voltage and the low voltage, based on the voltage setting signal, the m being an integer equal to or greater than 2; and
an output selection portion configured to selectively output one of the first reference voltage and the second reference voltage based on the voltage selection signal.

13. The semiconductor apparatus of claim 12, wherein the output selection portion includes:
a first switch configured to provide a first output node with a voltage, which is outputted from the first voltage generation portion, based on the voltage selection signal such that the first reference voltage is output through the first output node; and
a second switch configured to provide a second output node with a voltage, which is outputted from the second voltage generation portion, based on the voltage selection signal such that the second reference voltage is output through the second output node.

14. The semiconductor apparatus of claim 13, further comprising a disable portion configured to disable an unselected reference voltage among the first reference voltage and the second reference voltage based on the voltage selection signal.

15. The semiconductor apparatus of claim 14, wherein the disable portion includes:
a third switch configured to drive the first output node to the low voltage based on the voltage selection signal; and
a fourth switch configured to drive the second output node to the low voltage based on the voltage selection signal.

16. The semiconductor apparatus of claim 12, further comprising a reference voltage decoder configured to generate the voltage setting signal and the voltage selection signal based on an address signal.

17. The semiconductor apparatus of claim 16, wherein the reference voltage decoder generates the voltage setting signal based on at least partial bits of the address signal, and generates the voltage selection signal based on at least one bit of the address signal.

18. The semiconductor apparatus of claim 12, wherein the reference voltage generating circuit disables the unselected one of the first reference voltage and the second reference voltage.

19. A semiconductor apparatus comprising:
a reference voltage generating circuit configured to generate, based on a voltage setting signal, a first reference voltage and a second reference voltage, and to output one of the first reference voltage and the second reference voltage based on a voltage selection signal; and
a buffer configured to generate an output signal based on the first reference voltage, the second reference voltage and an input signal,
wherein the reference voltage generating circuit includes:
a plurality of unit resistances serially coupled to each other between a high voltage node and a low voltage node, the high voltage having a higher level than the low voltage;
a first voltage generation portion configured to generate the first reference voltage from one among first to $n^{th}$ unit resistances of a first range, based on the voltage setting signal, the n being an integer equal to or greater than 3;
a second voltage generation portion configured to generate the second reference voltage from one among $m^{th}$ to $(m+n)^{th}$ unit resistances of a second range, based on the voltage setting signal, the m being an integer equal to or greater than 2; and
an output selection portion configured to selectively output one of the first reference voltage and the second reference voltage based on the voltage selection signal.

20. The semiconductor apparatus of claim 19, further comprising a disable portion configured to disable an unselected one of the first reference voltage and the second reference voltage based on the voltage selection signal.

21. A semiconductor apparatus comprising:
a reference voltage generating circuit configured to generate, based on a voltage setting signal, a first reference voltage and a second reference voltage, and to output one of the first reference voltage and the second reference voltage based on a voltage selection signal; and
a buffer configured to generate an output signal based on the first reference voltage, the second reference voltage and an input signal,
wherein the buffer includes:
a first differential input portion coupled between a high voltage node and a low voltage node, and configured to change a voltage level of a positive output node based on the first reference voltage and the second reference voltage; and
a second differential input portion coupled between the high voltage node and the low voltage node, and configured to change a voltage level of a negative output node based on the input signal, and
wherein the output signal is generated from the positive output node.

22. The semiconductor apparatus of claim 21, wherein the first differential input portion includes:
a first input section coupled between the high voltage node and the low voltage node, and configured to change the voltage level of the positive output node based on the first reference voltage; and a second input section coupled between the high voltage node and the low voltage node, and configured to change the voltage level of the positive output node based on the second reference voltage.

23. The semiconductor apparatus of claim 21, wherein the second differential input portion includes a third input section coupled between the high voltage node and the low voltage node, and configured to change the voltage level of the negative output node based on the input signal.

24. The semiconductor apparatus of claim 23, the second differential input portion further comprising:
a fourth input section coupled to the negative output node, and configured to receive the low voltage.

25. The semiconductor apparatus of claim 21, wherein the buffer is configured to calculate a target reference voltage and configured to generate the output signal by amplifying a level of the input signal with a level of the target reference voltage.

26. The semiconductor apparatus of claim 25, wherein the target reference voltage is an average of the first reference voltage and the second reference voltage.

\* \* \* \* \*